United States Patent
Lin et al.

(10) Patent No.: US 12,100,697 B2
(45) Date of Patent: Sep. 24, 2024

(54) SEMICONDUCTOR PACKAGE STRUCTURE

(71) Applicant: Advanced Semiconductor Engineering, Inc., Kaohsiung (TW)

(72) Inventors: Chang-Yu Lin, Kaohsiung (TW); Cheng-Hsuan Wu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 15 days.

(21) Appl. No.: 17/185,499

(22) Filed: Feb. 25, 2021

(65) Prior Publication Data

US 2022/0271019 A1    Aug. 25, 2022

(51) Int. Cl.

| | |
|---|---|
| *H01L 23/48* | (2006.01) |
| *G02B 6/42* | (2006.01) |
| *H01L 21/78* | (2006.01) |
| *H01L 23/00* | (2006.01) |
| *H01L 23/31* | (2006.01) |
| *H01L 23/52* | (2006.01) |
| *H01L 25/16* | (2023.01) |

(52) U.S. Cl.
CPC .......... *H01L 25/167* (2013.01); *G02B 6/4202* (2013.01); *H01L 21/78* (2013.01); *H01L 23/3107* (2013.01); *H01L 24/24* (2013.01); *H01L 24/13* (2013.01); *H01L 24/16* (2013.01); *H01L 24/29* (2013.01); *H01L 24/32* (2013.01); *H01L 24/73* (2013.01); *H01L 24/83* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/214* (2013.01); *H01L 2224/24146* (2013.01); *H01L 2224/2919* (2013.01); *H01L 2224/32225* (2013.01); *H01L 2224/73204* (2013.01); *H01L 2224/73259* (2013.01); *H01L 2224/83203* (2013.01)

(58) Field of Classification Search
CPC ... H01L 25/167; H01L 21/78; H01L 23/3107; H01L 24/24; H01L 2224/214; H01L 2224/24146; G02B 6/4202
USPC ........................................................ 257/777
See application file for complete search history.

(56) References Cited

U.S. PATENT DOCUMENTS

| | | | |
|---|---|---|---|
| 9,293,448 B2* | 3/2016 | Nguyen | ............... H01L 33/34 |
| 10,403,603 B2* | 9/2019 | Park | ................ H01L 23/3157 |
| 10,830,950 B2* | 11/2020 | Tanaka | ............. G02B 6/12004 |
| 2008/0012096 A1* | 1/2008 | Sin | ................... B23K 26/389 |
| | | | 257/E23.179 |
| 2009/0091042 A1* | 4/2009 | Do | ...................... H01L 24/33 |
| | | | 257/E23.024 |

(Continued)

*Primary Examiner* — Jami Valentine Miller
*Assistant Examiner* — Dilinh P Nguyen
(74) *Attorney, Agent, or Firm* — FOLEY & LARDNER LLP (57) ABSTRACT

A semiconductor package structure and a method of manufacturing a semiconductor package structure are provided. The semiconductor package structure includes a first electronic device and a second electronic device. The first electronic device has an active surface and a lateral surface angled with the active surface, and the lateral surface includes a first portion and a second portion that is non-coplanar with the first portion. The second electronic device is disposed on the active surface of the first electronic device.

19 Claims, 8 Drawing Sheets

(56) References Cited

U.S. PATENT DOCUMENTS

| | | | |
|---|---|---|---|
| 2015/0371966 A1* | 12/2015 | Yoshida | H01L 24/05 |
| | | | 257/620 |
| 2017/0254968 A1 | 9/2017 | Ding et al. | |
| 2017/0261708 A1* | 9/2017 | Ding | G02B 6/4246 |
| 2018/0024299 A1* | 1/2018 | Leijtens | G02B 6/264 |
| | | | 385/28 |
| 2019/0369341 A1* | 12/2019 | Shaw | G02B 6/4204 |
| 2020/0091126 A1* | 3/2020 | Lin | H01L 24/20 |
| 2021/0134751 A1* | 5/2021 | Lu | H01L 24/06 |
| 2021/0202459 A1* | 7/2021 | Chang Chien | H01L 21/565 |

\* cited by examiner

SEMICONDUCTOR PACKAGE STRUCTURE

BACKGROUND

1. Technical Field

The present disclosure relates generally to a semiconductor package structure and a method of manufacturing a semiconductor package structure, particularly to a semiconductor package structure including two or more electronic devices and a method of manufacturing a semiconductor package structure including two or more electronic devices.

2. Description of the Related Art

A chip-on-chip (CoC) package usually includes two electronic components stacked on each other. The stacked electronic components are in electrical communication with each other through wire bonding. The bond wires, however, have high resistance and long transmission path. Therefore, CoC packages suffer from signal integrity, particularly in high frequency application. In addition, the limitation of conventional wire bonding signal transmission lies in that the high impedance caused by the extended transmission path prevents high speed data rate, for example, 100 Gbit/s, 400 Gbit/s, or 1.6 Tbit/s, from realization. In addition, silicon photonics and optical engines usually require high speed data rate with the integration of at least an electronic IC (EIC) and a photonic IC (PIC).

In light of the above, electronic ICs or dies may be formed in a package followed by each of the electronic ICs or dies flip-chip bonding to a photonic IC or die. However, singulation operations performed on the package including the electronic ICs or dies may damage the active surface of the photonic die.

SUMMARY

In one or more embodiments, a semiconductor package structure includes a first electronic device and a second electronic device. The first electronic device has an active surface and a lateral surface angled with the active surface, and the lateral surface includes a first portion and a second portion that is non-coplanar with the first portion. The second electronic device is disposed on the active surface of the first electronic device.

In one or more embodiments, a method of manufacturing a semiconductor package structure includes the following operations: providing a semiconductor substrate; forming a first trench in the semiconductor substrate, the first trench penetrating from a first surface through a portion of the semiconductor substrate; disposing a second electronic device on the first surface of the semiconductor substrate; and separating the semiconductor substrate into a plurality of first electronic devices along the first trench, wherein an edge of the second electronic device is protruded out of a lateral surface of the first electronic device.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
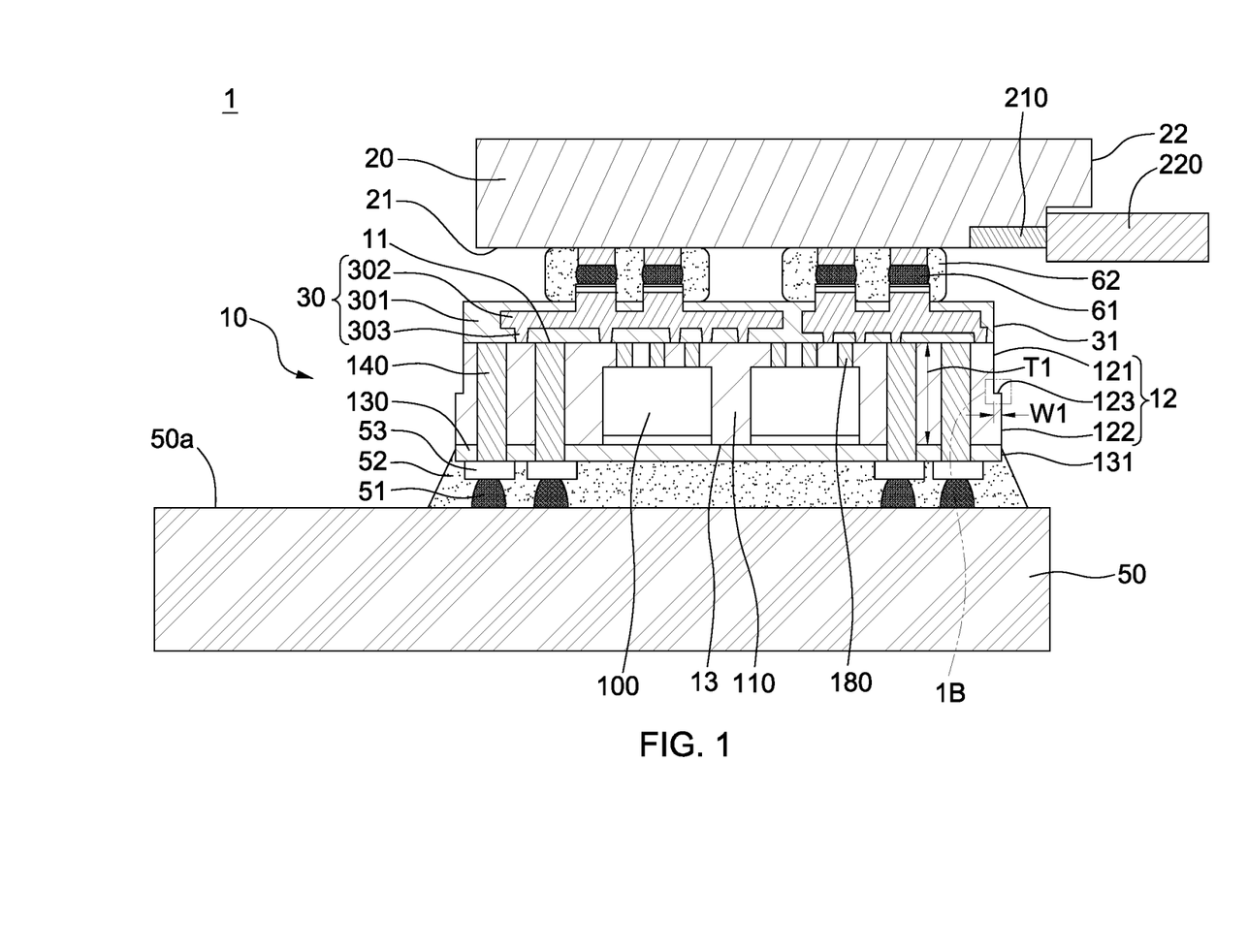
FIG. 1 illustrates a cross-sectional view of a semiconductor package structure in accordance with some embodiments of the present disclosure.

FIG. 1 illustrates a cross-sectional view of a semiconductor package structure 1 in accordance with some embodiments of the present disclosure. The semiconductor package structure 1 includes a substrate 50, electronic devices 10 and 20, a redistribution layer 30, an insulating layer 130, and one or more conductive elements 140 and 180.

The substrate 50 may be, for example, a printed circuit board, such as a paper-based copper foil laminate, a composite copper foil laminate, or a polymer-impregnated glass-fiber-based copper foil laminate. The substrate 50 may include an interconnection structure, such as a redistribution layer (RDL) or a grounding element. The substrate 50 may include an interposer, such as an interposer including one or more through silicon vias (TSVs). The substrate 50 has a surface 50a. The substrate 50 may include one or more conductive pads (not shown) in proximity to, adjacent to, or embedded in and exposed at the surface 50a of the substrate 50. The substrate 50 may include a solder resist (not shown) on the surface 50a of the substrate 50 to fully expose or to expose at least a portion of the conductive pads for electrical connections.

The electronic device 10 is disposed on the substrate 50. The electronic device 10 may be electrically connected to the substrate 50 through conductive bumps 51 covered by an underfill 52. In some embodiments, the conductive bumps 51 may contact conductive pads 53 (or UBMs) proximity to or adjacent to a surface 13 (also referred to as "a backside surface") of the electronic device 10. In some embodiments, the conductive bump 51 may be or include gold (Au), silver (Ag), copper (Cu), nickel (Ni), another metal, a solder alloy, or a combination of two or more thereof. In some embodiments, the conductive pad 53 may be or include Au, Ag, Cu, Ni, another metal, a solder alloy, or a combination of two or more thereof. In some embodiments, the underfill 52 may include an epoxy resin, a molding compound (e.g., an epoxy molding compound or other molding compound), polyimide, a phenolic compound or material, a material including a silicone dispersed therein, or a combination thereof.

The electronic device 10 has a surface 11 (also referred to as "an active surface") and a sidewall 12 (also referred to as "a lateral surface) angled with the surface 11. In some embodiments, the electronic device 10 is electrically connected to external elements or devices through the active surface (i.e., the surface 11) of the electronic device 10. In some embodiments, the conductive elements 140 are in proximity to, adjacent to, or embedded in and exposed at the active surface (i.e., the surface 11) of the electronic device 10 for electrically connecting to the redistribution layer 30. In some embodiments, the sidewall 12 includes a portion 121 and a portion 122 that is non-coplanar with the portion 121. In some embodiments, a surface roughness of the portion 121 of the sidewall 12 of the electronic device 10 is different from a surface roughness of the portion 122 of the sidewall 12 of the electronic device 10. In some embodiments, a surface roughness of the portion 121 of the sidewall 12 of the electronic device 10 is less than a surface roughness of the portion 122 of the sidewall 12 of the electronic device 10. In some embodiments, the sidewall 12 of the electronic device 10 includes a stepped structure. In some embodiments, the stepped structure of the sidewall 12 of the electronic device 10 includes the portions 121 and 122 having different surface roughness. In some embodiments, the portion 121 and the portion 122 of the sidewall 12 are formed by different operations, and thus the as-formed portions 121 and 122 have different surface roughness. For example, the portions 121 and 122 may be formed by different cutting processes using cutting apparatuses having different widths. Alternatively, for example, the portion 121 may be formed by a pre-cutting operation using a cutting apparatus, and then the portion 122 may be formed by separating a portion of a substrate structure by applying a force without using a cutting apparatus. The details will be discussed hereinafter.

In some embodiments, the portion 121 of the sidewall 12 of the electronic device 10 is proximal to the surface 11 (also referred to as "the active surface") of the electronic device 10 and recessed from the portion 122 of the sidewall 12. In some embodiments, the sidewall 12 of the electronic device 10 further includes a portion 123 connecting the portion 121 and the portion 122. In some embodiments, the portion 123 of the sidewall 12 of the electronic device 10 is angled with the portion 121 of the sidewall 12 of the electronic device 10. In some embodiments, the portion 123 of the sidewall 12 of the electronic device 10 is angled with the portion 122 of the sidewall 12 of the electronic device 10. In some embodiments, a width W1 of the portion 123 may be from about 20 μm to about 40 μm.

In some embodiments, the electronic device 10 includes one or more electronic dies 100 and an encapsulant 110 (also referred to as "a molding compound") encapsulating the electronic dies 100. In some embodiments, the electronic dies 100 may include a modulator driver (DRV), a transimpedance amplifier (TIA), or a combination thereof. In some embodiments, a surface (or a sidewall) of the encapsulant 110 includes the portions 121 and 122 of the sidewall 12 of the electronic device 10. In some embodiments, a surface (or a sidewall) of the encapsulant 110 (e.g., the molding compound) includes the stepped structure of the sidewall 12 of the electronic device 10. In some embodiments, a thickness T1 of the encapsulant 110 may be about 100 μm. The encapsulant 110 may include an epoxy resin having fillers, a molding compound (e.g., an epoxy molding compound or other molding compound), polyimide, a phenolic compound or material, a material with a silicone dispersed therein, or a combination thereof.

The electronic device 20 may be disposed on the surface 11 (e.g., the active surface) of the electronic device 10. In some embodiments, the electronic device 10 is electrically connected to the electronic device 20 in a face-to-face fashion. In some embodiments, the electronic device 20 is bonded to the electronic device 10 through thermocompression non-conductive paste (TCNCP) bonding technique. For example, conductive bumps 61 between the electronic device 10 and the electronic device 20 are pressurized under a predetermined temperature range with a non-conductive paste (NCP) 62.

In some embodiments, the electronic device 20 has a surface 21 (also referred to "an active surface") facing the surface 11 (also referred to as "the active surface") of the electronic device 10. In some embodiments, the electronic device 20 further has a lateral surface 22 angled with the surface 21. In some embodiments, the lateral surface 22 of the electronic device 20 is protruded from (or out of) the sidewall 12 of the electronic device 10. In some embodiments, an edge (e.g., at least a portion of the lateral surface 22) of the electronic device 20 is protruded from (or out of) the sidewall 12 (also referred to as "the lateral surface") of the electronic device 10. In some embodiments, the electronic device 20 includes a photonic die.

In some embodiments, the electronic device 20 includes an optical component 210 disposed on or proximal to the surface 21 (also referred to "the active surface") of the electronic device 20. In some embodiments, a projection of the optical component 210 on the substrate 50 overlaps a projection of the electronic device 20 on the substrate 50. In some embodiments, the optical component 210 includes a waveguide, a laser diode, a fiber coupling structure, an optical modulator, or a combination thereof.

In some embodiments, the edge (e.g., at least a portion of the lateral surface 22) of the semiconductor device 20 and the sidewall 12 (also referred to as "the lateral surface") of the electronic device 10 define a space configured to accommodate an optical component 220. In some embodiments, the optical component 220 includes one or more optical fibers. In some embodiments, the optical component 220 includes an optical fiber array. In some embodiments, the optical component 220 is connected to the optical component 210.

The redistribution layer 30 may be disposed on the surface 11 (e.g., the active surface) of the electronic device 10. In some embodiments, the redistribution layer 30 is electrically connected to the active surface of the electronic device 10 through the conductive elements 180. In some embodiments, the conductive elements 180 may be or includes conductive pillars and/or conductive studs, such as metal pillars and/or metal studs. In some embodiments, a height of the conductive elements 180 is about 40 μm. In some embodiments, the redistribution layer 30 includes a dielectric layer 301, one or more conductive traces 302, and one or more through vias 303. In some embodiments, a surface 31 of the redistribution layer 30 is substantially coplanar with the portion 121 of the sidewall 12 of the electronic device 10. In some embodiments, a surface (e.g., at least a portion of the surface 31) of the dielectric layer 301 of the redistribution layer 30 is substantially coplanar with the portion 121 of the sidewall 12 of the electronic device 10. In some embodiments, the redistribution layer 30 (e.g., the dielectric layer 301) contacts the encapsulant 110. In some embodiments, the redistribution layer 30 (e.g., the dielectric layer 301) directly contacts or physically contacts the encapsulant 110.

The insulating layer 130 may be disposed on the surface 13 (also referred to as "the backside surface), opposite to the surface 11 (e.g., the active surface), of the electronic device 10. In some embodiments, the one or more electronic dies 100 are attached to the insulating layer 130 through an adhesive layer (e.g., a DAF). In some embodiments, a surface 131 of the insulating layer 130 is substantially coplanar with the portion 122 of the sidewall 12 of the electronic device 10. In some embodiments, the insulating layer 130 contacts the encapsulant 110. In some embodiments, the insulating layer 130 directly contacts or physically contacts the encapsulant 110.

In some embodiments, the one or more conductive elements 140 pass through the encapsulant 110 and electrically connect to the redistribution layer 30. In some embodiments, the conductive elements 140 pass through the encapsulant 110 and the insulating layer 130 to electrically connect to the conductive pads 53 and the conductive bumps 51, so as to electrically connect the redistribution layer 30 and the substrate 50. In some embodiments, the conductive elements 140 may be or include conductive pillars, such as metal pillars.

Figure 1A:
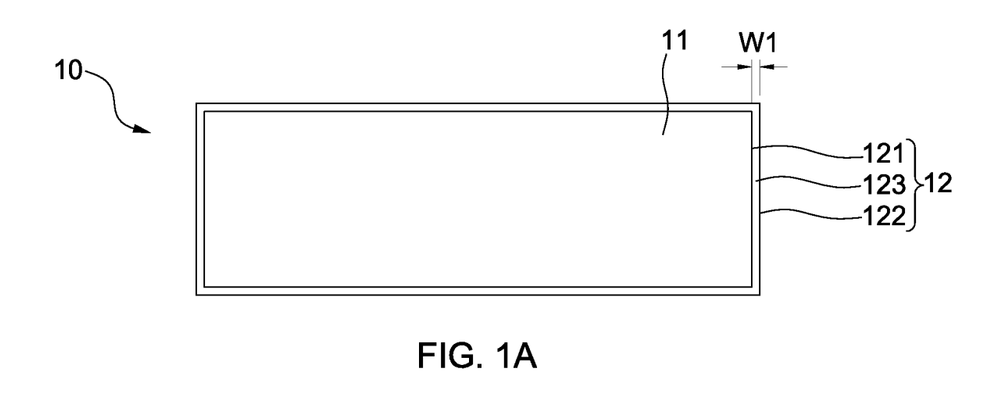
FIG. 1A illustrates a top view of a portion of a semiconductor package structure in accordance with some embodiments of the present disclosure.

FIG. 1A illustrates a top view of a portion of a semiconductor package structure 1 in accordance with some embodiments of the present disclosure. In some embodiments, FIG. 1A illustrates a top view of the electronic device 10.

In some embodiments, the sidewall 12 of the electronic device 10 surrounds a periphery of the electronic device 10. In some embodiments, the portion 123 of the sidewall 12 is exposed from the surface 11 of the electronic device 10 from a top view perspective. In some embodiments, the portion 121 of the sidewall 12 surrounds a periphery of the electronic device 10. In some embodiments, the portion 122 of the sidewall 12 surrounds a periphery of the electronic device 10. In some embodiments, the portion 123 of the sidewall 12 surrounds a periphery of the electronic device 10.

Figure 1B:
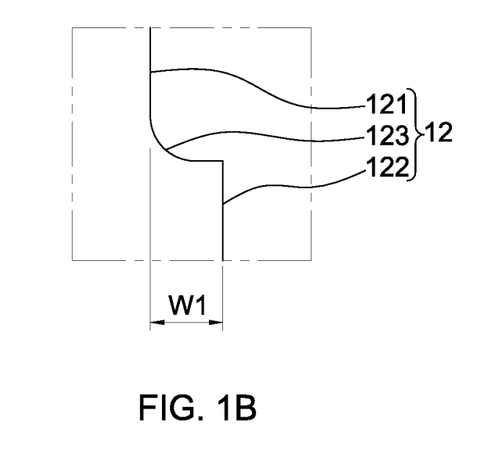
FIG. 1B illustrates a cross-sectional view of a portion of a semiconductor package structure in accordance with some embodiments of the present disclosure.

FIG. 1B illustrates a cross-sectional view of a portion of a semiconductor package structure 1 in accordance with some embodiments of the present disclosure. In some embodiments, FIG. 1B illustrates a cross-sectional view of the portion 1B of the semiconductor package structure 1 in FIG. 1.

In some embodiments, the portion 121 of the sidewall 12 of the electronic device 10 is connected to the portion 123 of the sidewall 12 of the electronic device 10 at an intersection. In some embodiments, the intersection of the portion 121 and the portion 123 of the sidewall 12 of the electronic device 10 may be or include a curved corner. In some embodiments, the intersection of the portion 121 and the portion 123 of the sidewall 12 of the electronic device 10 may be or include a round corner. In some embodiments, the intersection of the portion 121 and the portion 123 of the sidewall 12 of the electronic device 10 may be or include a fillet. In some embodiments, the portion 122 of the sidewall 12 of the electronic device 10 is connected to the portion 123 of the sidewall 12 of the electronic device 10. In some embodiments, the intersection of the portion 122 and the portion 123 of the sidewall 12 of the electronic device 10 may be or include a sharp or an acute angle.

Figure 2:
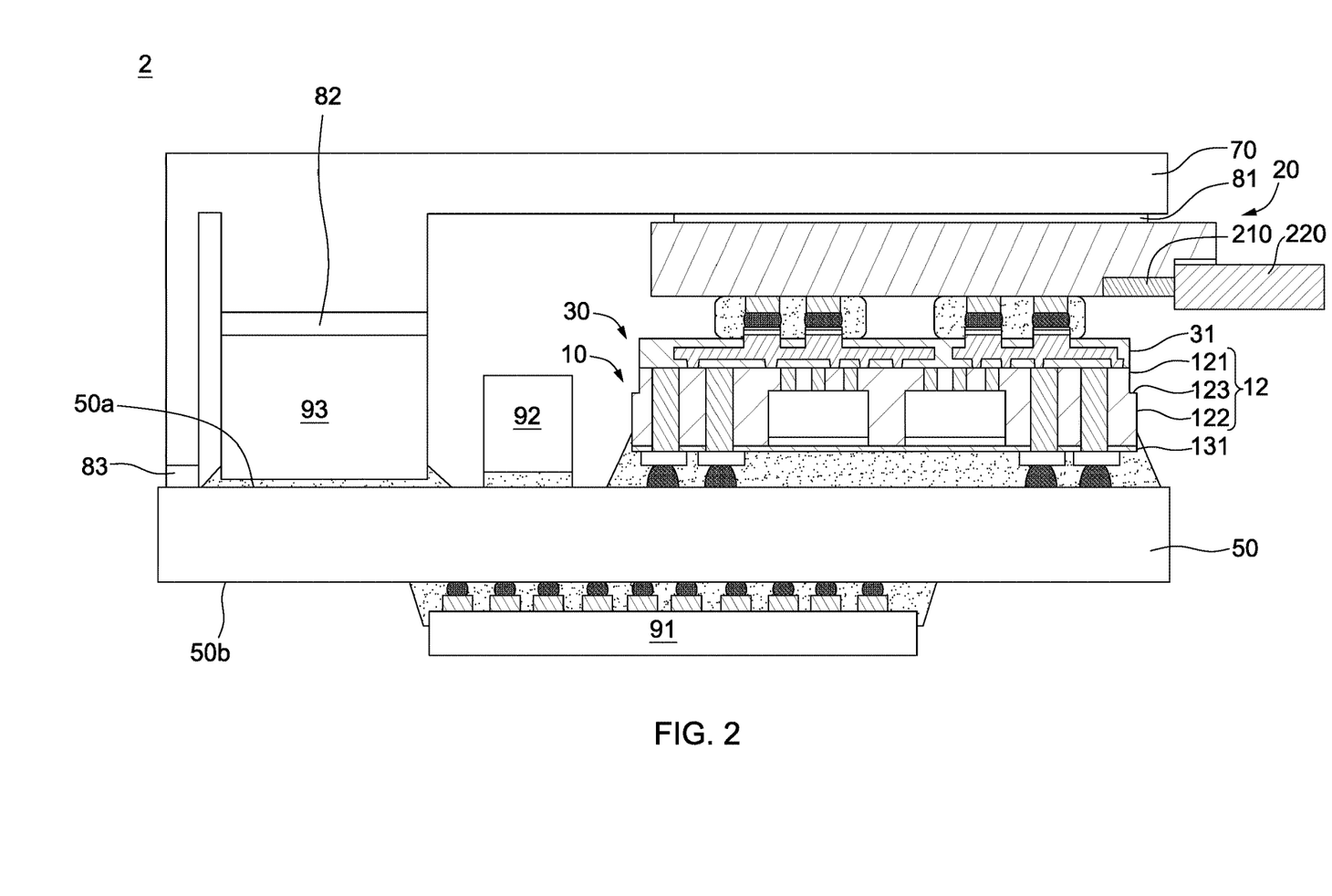
FIG. 2 illustrates a cross-sectional view of a semiconductor package structure in accordance with some embodiments of the present disclosure.

FIG. 2 illustrates a cross-sectional view of a semiconductor package structure 2 in accordance with some embodiments of the present disclosure. The semiconductor package structure 2 is similar to the semiconductor package structure 1 in FIG. 1, and some of the differences therebetween are described below.

The semiconductor package structure 2 may further include a heat sink 70 and electronic devices 91, 92, and 93. In some embodiments, the electronic device 91 is disposed on a surface 50b opposite to the surface 50a of the substrate 50. In some embodiments, the electronic device 91 may be or include Bluetooth module (BTM), a power management integrated circuit (PMIC), or a combination thereof. The electronic device 91 may be bonded to the substrate 50 through solder bumps covered by an underfill. In some embodiments, the electronic devices 92 and 93 are disposed on the surface 50a of the substrate 50. In some embodiments, the electronic devices 92 and 93 may be bonded to the substrate 50 by surface mount technology (SMT).

In some embodiments, the heat sink 70 is connected to the electronic device 20 through an adhesive layer 81. In some embodiments, the adhesive layer 81 may be or include a thermal interface material (TIM). Accordingly, an enhanced heat dissipation may be provided for the electronic device 20. In some embodiments, the heat sink 70 is connected to the electronic device 93 and the surface 50a of the substrate 50 through adhesive layers 82 and 83, respectively.

Figure 3:
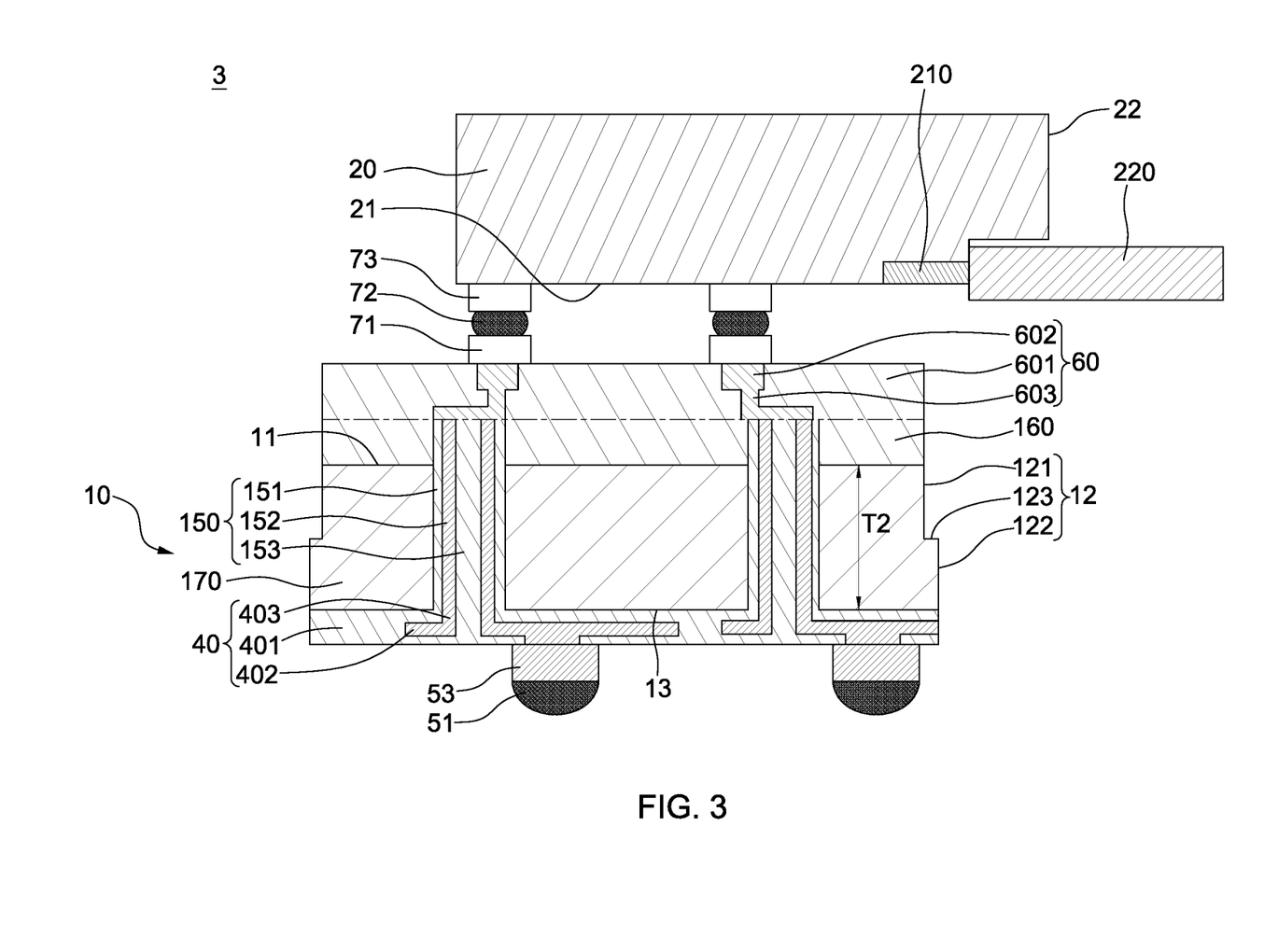
FIG. 3 illustrates a cross-sectional view of a semiconductor package structure in accordance with some embodiments of the present disclosure.

FIG. 3 illustrates a cross-sectional view of a semiconductor package structure 3 in accordance with some embodiments of the present disclosure. The semiconductor package structure 3 is similar to the semiconductor package structure 1 in FIG. 1, and some of the differences therebetween are described below.

In some embodiments, the semiconductor package structure 3 includes electronic devices 10 and 20 and redistribution layers 40 and 60. In some embodiments, the redistribution layers 40 and 60 are disposed on two opposite surfaces (e.g., the surface 11 and the surface 13) of the electronic device 10. In some embodiments, the electronic device 20 is electrically connected to the electronic device 10 through the redistribution layer 60.

In some embodiments, the electronic device 10 includes an insulating layer 160, a semiconductor substrate 170, and one or more conductive vias 150 (also referred to as "through silicon vias (TSVs)"). In some embodiments, the insulating layer 160 is on the semiconductor substrate 170, and the conductive via 150 passes through the insulating layer 160 and the semiconductor substrate 170. In some embodiments, the conductive via 150 passes through the insulating layer 160 and the semiconductor substrate 170 of the electronic device 10 and electrically connects to the redistribution layers 40 and 60. In some embodiments, a thickness T2 of the semiconductor substrate 170 may be about 75 μm. In some embodiments, the semiconductor substrate 170 may be or include a silicon substrate.

In some embodiments, the conductive via 150 includes an insulating liner 151, a conductive layer 152 on the insulating liner 151, and an insulating filling 153 surrounded by the conductive layer 152. In some embodiments, the redistribution layer 40 includes a dielectric layer 401, one or more conductive traces 402, and one or more through vias 403. In some embodiments, conductive bumps 51 (also referred to as "solder bumps") are connected to the conductive via 150 through the redistribution layer 40 (e.g., the conductive traces 402 and the through vias 403).

In some embodiments, the redistribution layer 60 includes a dielectric layer 601, one or more conductive traces 602, and one or more through vias 603. In some embodiments, an UBM 71 is connected to the conductive via 150 through the redistribution layer 60 (e.g., the conductive traces 602 and the through vias 603). In some embodiments, the electronic device 20 is connected to the redistribution layer 60 through conductive pads 73, conductive bumps 72, and the UBMs 71.

FIG. 4A, FIG. 4B, FIG. 4C, and FIG. 4D illustrate various operations in a method of manufacturing a semiconductor package structure 1 in accordance with some embodiments of the present disclosure.

Figure 4A:
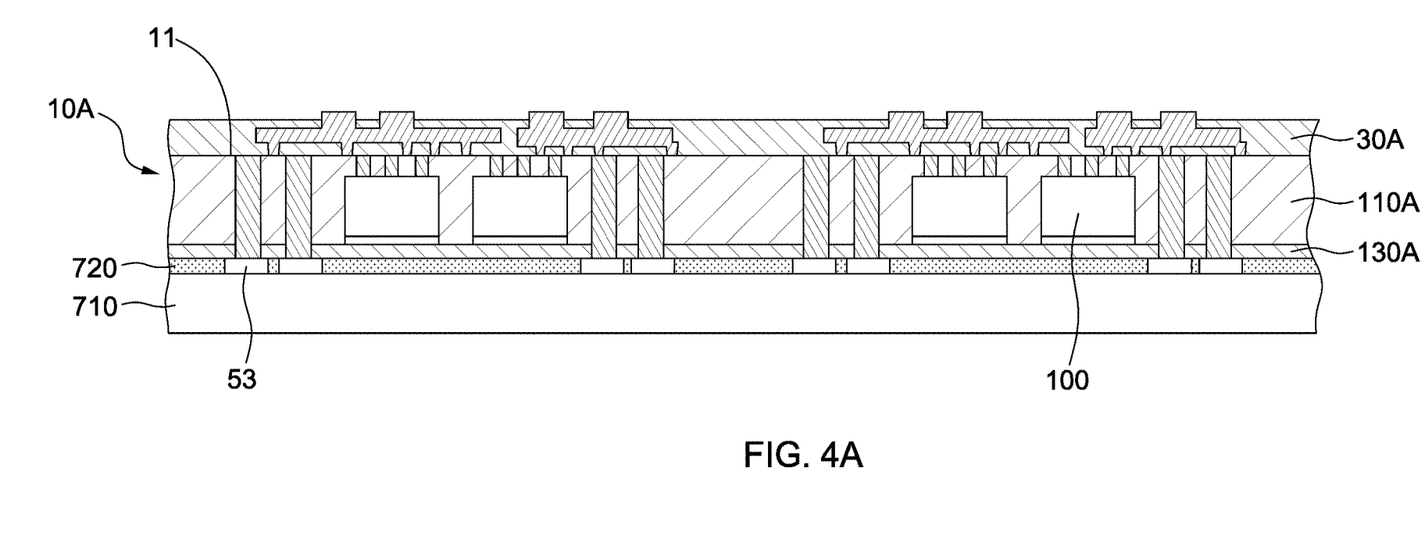
FIG. 4A, FIG. 4B, FIG. 4C, and FIG. 4D illustrate various operations in a method of manufacturing a semiconductor package structure in accordance with some embodiments of the present disclosure.

Referring to FIG. 4A, a semiconductor substrate 10A is provided. In some embodiments, the semiconductor substrate 10A is attached to a carrier 710 through an adhesive layer 720. In some embodiments, the semiconductor substrate 10A may include a plurality of electronic dies 100, an encapsulant 110A encapsulating the electronic dies 100, a redistribution layer 30A over the electronic dies 100, an insulating layer 130A on the encapsulant 110A, and one or more conductive pads 53 on the insulating layer 130A. In some embodiments, the conductive pads 53 may be pressed into and at least partially embedded in the adhesive layer 720. In some embodiments, the carrier 710 may be a rigid board, for example, a glass substrate.

Figure 4B:
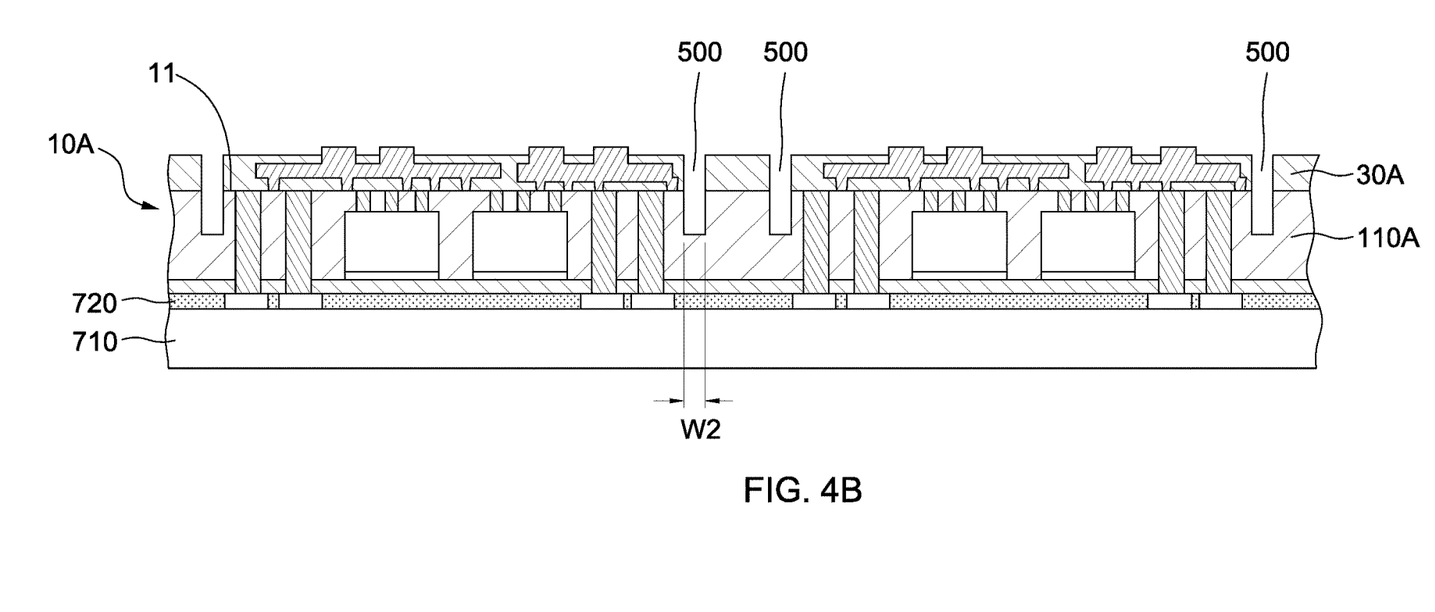

Referring to FIG. 4B, a trench 500 is formed in the semiconductor substrate 10A. In some embodiments, the trench 500 penetrates from a surface 11 through a portion of the semiconductor substrate 10A. In some embodiments, the trench 500 penetrates through the redistribution layer 30A and a portion of the semiconductor substrate 10A. In some embodiments, a width W2 of the trench 500 may be from about 80 μm to about 120 μm. In some embodiments, the trench 500 penetrates from the surface 11 through a portion of the encapsulant 110A. In some embodiments, forming the trench 500 may include cutting the semiconductor substrate 10A from the surface 11 of the semiconductor substrate 10A by a first cutting apparatus, which is also referred to as "a pre-cutting operation". In some embodiments, the first cutting apparatus may be or include a cutting wheel blade. In some embodiments, the first cutting apparatus (e.g., the cutting wheel blade) may have a width substantially the same as the width W2 of the as-formed trench 500. In some embodiments, the pre-cutting operation may be performed by the first cutting apparatus along a predetermined cutting line, so that the accuracy of the cutting alignment can be relatively satisfactory, and the width W2 of the entire trench 500 can be relatively constant. Moreover, the width W2 of the trench 500 can vary according to the actual applications of the semiconductor package structure 1 by using a suitable cutting apparatus, such that the design flexibility of the semiconductor package structure 1 can be increased (e.g., by varying the size of the trench 500). In addition, the trench 500 may penetrate through various materials including dielectric materials and metal materials since the cutting apparatus can cut through composite layers regardless the materials thereof, and thus the process of forming the trench 500 is simplified. In some other embodiments, the trench 500 may be formed by a laser cutting process.

In some embodiments, the semiconductor substrate 10A is attached to the carrier 710 through the adhesive layer 720 prior to forming the trench 500 in the semiconductor substrate 10A; that is, the semiconductor substrate 10A is attached to the carrier 710 through the adhesive layer 720 prior to the pre-cutting operation. In some embodiments, the pre-cutting operation is performed from the active surface (i.e., the surface 11) of the semiconductor substrate 10A. In some embodiments, the pre-cutting operation partially separates the semiconductor substrate 10A from the active surface of the semiconductor substrate 10A.

Figure 4C:
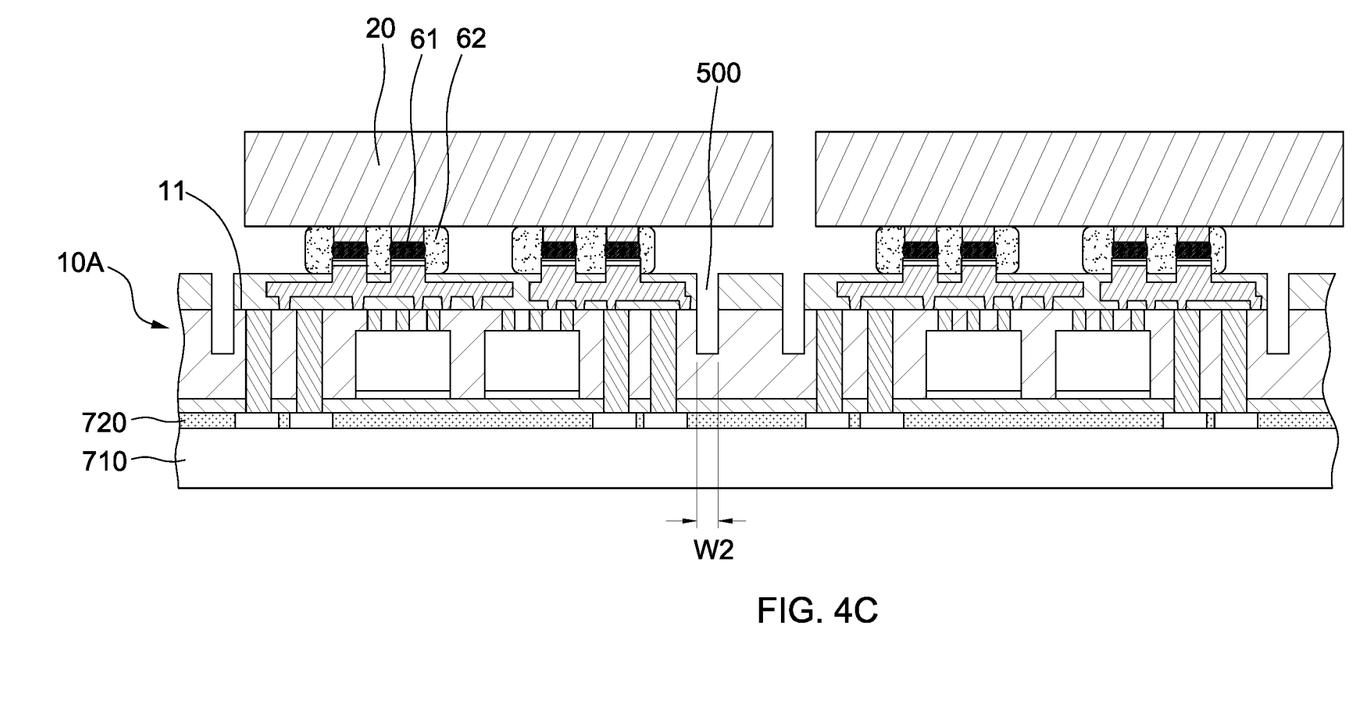

Referring to FIG. 4C, one or more electronic devices 20 are disposed on the surface 11 of the semiconductor substrate 10A. In some embodiments, forming the trench 500 in the semiconductor substrate 10A is prior to disposing the electronic device 20 on the surface 11 of the electronic device 10. In some embodiments, the electronic device 20 is connected to the electronic device 10 through thermocompression non-conductive paste (TCNCP) bonding technique. For example, conductive bumps 61 may be formed between the semiconductor substrate 10A and the electronic device 20 pressurized under a predetermined temperature range with a non-conductive paste (NCP) 62. In some embodiments, the electronic device 20 is connected to the active surface (i.e., the surface 11) of the semiconductor substrate 10A in a face-to-face fashion after the pre-cutting operation is performed from the active surface (i.e., the surface 11) of the semiconductor substrate 10A.

Figure 4D:
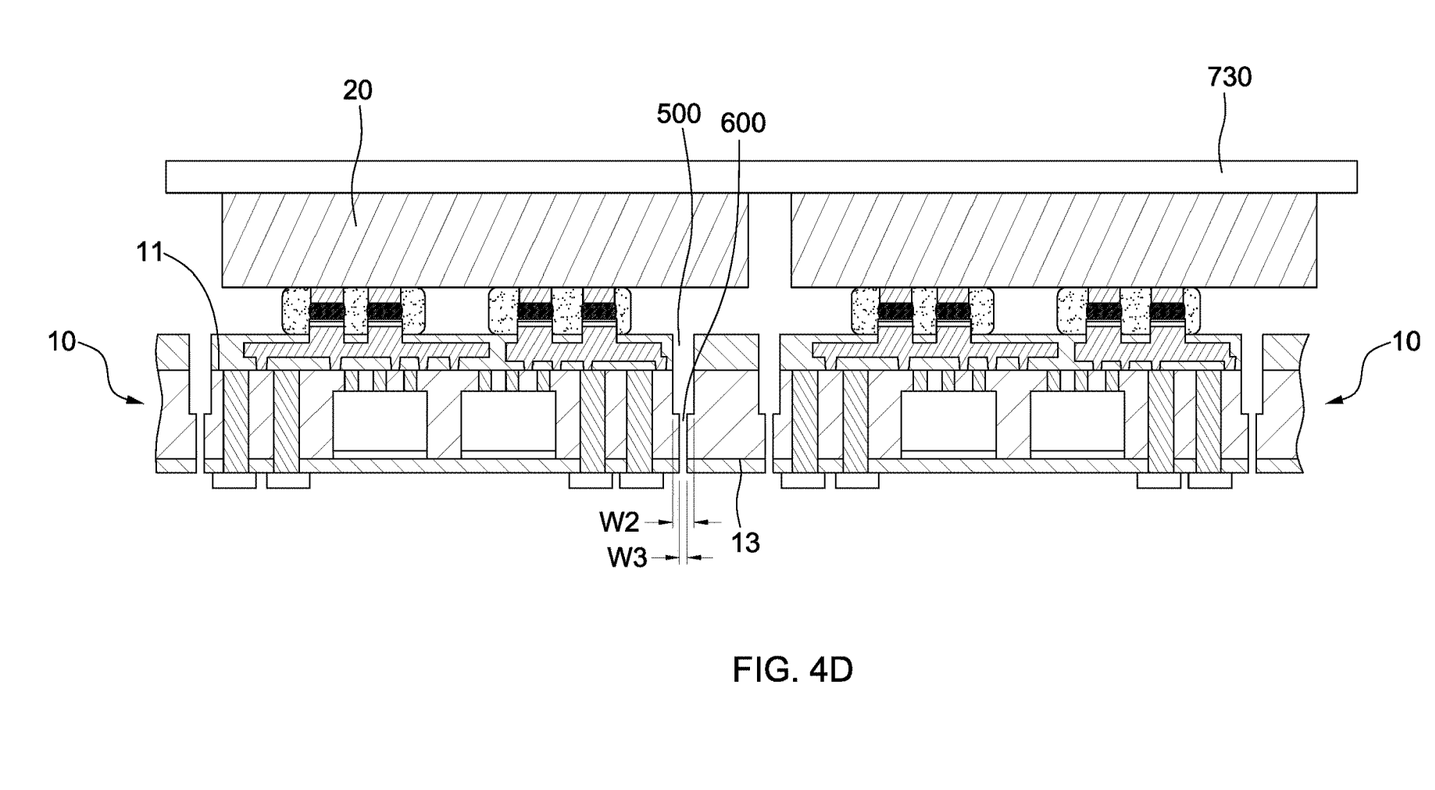

Referring to FIG. 4D, the carrier 710 and the adhesive layer 720 are removed, and the semiconductor substrate 10A is separated into a plurality of electronic devices 10 along the trench 500, which is also referred to as "a final-separation operation". In some embodiments, the semiconductor substrate 10A is separated by separating the semiconductor substrate 10A from a surface 13 (also referred to as "a backside surface") opposite to the surface 11 (also referred to as "the active surface") of the semiconductor substrate 10A. In some embodiments, removing the carrier 710 and the adhesive layer 720 is prior to separating the semiconductor substrate 10A. In some embodiments, removing the carrier 710 and the adhesive layer 720 is prior to the final-separation operation. In some embodiments, the final-separation operation separates the portion of the semiconductor substrate 10A remained unseparated after the pre-cutting operation. In some embodiments, the electronic devices 20 are disposed on a dicing tape 730 prior to separating the semiconductor substrate 10A. In some embodiments, the dicing tape 730 is removed after separating the semiconductor substrate 10A. In some embodiments, the dicing tape 730 may be or include a UV-cured resin material.

In some comparative embodiments, after active surfaces of electronic devices 20 photonic dies are bonded to the active surface of the semiconductor substrate 10A, the semiconductor substrate 10A may be separated by cutting through the semiconductor substrate 10A from the backside surface in a single operation, thereby the active surfaces of the electronic devices 20 may be damaged by the cutting operation. In contrast, according to some embodiments of the present disclosure, the electronic device 20 is connected to the active surface of the semiconductor substrate 10A in a face-to-face fashion after the pre-cutting operation is performed from the active surface of the semiconductor substrate 10A to form the trench 500, and then the semiconductor substrate 10A is fully separated into singulated units by separating the semiconductor substrate 10A along the trench 500 from the backside surface of the semiconductor substrate 10A (i.e., the final-separation operation). Therefore, the active surface of the electronic device 20 can be prevented from damage caused by either the pre-cutting operation or the final-separation operation.

Moreover, in some comparative embodiments, electronic devices 10 and electronic devices 20 are bonded by a chip-on-chip (CoC) process in order to prevent the active surfaces of the electronic devices 20 (e.g., photonic dies) from being damaged by the singulation operation for forming the electronic devices 10 (e.g., including electronic dies). However, the electronic devices 10 are required to be disposed on a dicing tape prior to bonding the electronic devices 20 (e.g., photonic dies) to the electronic devices 10 (e.g., including electronic dies), and warpage can easily occur since the dicing tape can hardly provide sufficient support for the electronic devices 10 and 20 in the bonding process.

In contrast, according to some embodiments of the present disclosure, the electronic device 20 is connected to the semiconductor substrate 10A after the pre-cutting operation and prior to the final-separation operation, and thus the electronic devices 10 and 20 can be bonded by a chip-on-wafer (CoW) process. Therefore, the wafer-level semiconductor substrate 10A can possess sufficient structural strength to lessen the possible warpage of the overall structure. In addition, the electronic devices 20 can be bonded to the wafer-level semiconductor substrate 10A which is attached to the carrier 710, the carrier 710 can further provide sufficient support in the bonding process, and thus the warpage of the overall structure can be effectively reduced.

Moreover, the redistribution layer 30 including multiple conductive traces/through vias and multiple dielectric materials is disposed on the electronic device 10 including a relatively thick encapsulant 110, or referring to FIG. 3, the relatively thin semiconductor substrate 170 includes the composite structure of the conductive vias 150 with only one thin layer of the UBM 71 disposed thereon, warpage may easily occur due to the CTE mismatch issues. According to some embodiments of the present disclosure, with the aforesaid design, the wafer-level semiconductor substrate 10A with the carrier 710 can still provide sufficient support in the bonding process and prevent occurrence of warpage.

Furthermore, according to some embodiments of the present disclosure, the final-separation operation is performed on the semiconductor substrate 10A after the adhesive layer 720 is removed, such that no adhesive residue may remain on the singulated structures, and thus contamination remained on the semiconductor package structure 1 can be significantly reduced.

In some embodiments, the semiconductor substrate 10A is separated by cutting the semiconductor substrate 10A from the surface 13 of the semiconductor substrate 10A by a cutting apparatus. In some embodiments, separating the semiconductor substrate 10A includes forming a trench 600 penetrating from the surface 13 of the semiconductor substrate 10A, and the trench 600 is connected to the trench 500. In some embodiments, the width W2 of the trench 500 is greater than a width W3 of the trench 600. In some embodiments, the width W3 of the trench 600 may be about 40 μm. In some embodiments, forming the trench 600 includes cutting the semiconductor substrate 10A from the surface 13 of the semiconductor substrate 10A by a second cutting apparatus that is different from the first cutting apparatus for forming the trench 500. In some embodiments, the second cutting apparatus may be or include a cutting wheel blade. In some embodiments, a cutting width of the first cutting apparatus is different from a cutting width of the second cutting apparatus. In some embodiments, a width of the cutting wheel blade of the first cutting apparatus is different from a width of the cutting wheel blade of the second cutting apparatus. In some embodiments, the second cutting apparatus (e.g., the cutting wheel blade) may have a width substantially the same as the width W3 of the as-formed trench 600.

In some other embodiments, separating the semiconductor substrate 10A may include applying a force to separate a portion of the semiconductor substrate 10A that is connecting the trench 500 to the surface 13 of the semiconductor substrate 10A. In some embodiments, the force is applied to separate a portion of the encapsulant 110A that is connecting a bottom surface of the trench 500 to the surface 13 of the semiconductor substrate 10A. In some other embodiments, separating the semiconductor substrate 10A may include applying a force to separate the semiconductor substrate 10A by bending, stretching, and/or breaking the semiconductor substrate 10A. In some embodiments, each of the electronic devices 10 includes a lateral surface portion 121 formed from forming the trench 500 and a lateral surface portion 122 formed from separating the semiconductor substrate 10A by applying the force.

According to some embodiments of the present disclosure, the trench 500 is formed in the structure illustrated in FIG. 4B prior to the singulation operation for forming the electronic devices 10, since the cutting process is relatively smooth, and thus the surface roughness of the sidewall of the trench 500 is relatively low. In some embodiments, the trench 600 is formed by further cutting through and separating the semiconductor substrate 10A as illustrated in FIG. 4D. In some embodiments, despite that the trench 600 may be formed by using a cutting apparatus, as the cutting apparatus keeps approaching toward the trench 500, the stress generated at the remained connected portion(s) of the semiconductor substrate 10A may tear the semiconductor substrate 10A apart and separate it into singulated electronic devices 10 before the cutting apparatus even actually reaches the trench 500. Therefore, the surface roughness of the sidewall of the trench 600 is relatively great. In some embodiments, a surface roughness of the lateral surface portion 122 is greater than a surface roughness of the lateral surface portion 121.

Next, referring to FIG. 1, a recess is formed on or proximal to a surface 21 (also referred to "an active surface") of the electronic device 20, and an optical component 210 is disposed in the recess of the electronic device 20. In some embodiments, the recess may be formed on or proximal to the surface 21 of the electronic device 20 prior to bonding the electronic device 20 to the semiconductor substrate 10A. According to some embodiments of the present disclosure, with the design of the pre-cutting operation and the final-separation operation, the electronic device 20 having an overhang structure can be bonded to the electronic device 10 without damaging the active surface of the electronic device 20, and thus the optical component 210 can be disposed at the overhanging region either prior to or after the electronic device 20 is bonded to the electronic device 10. Therefore, the flexibility of the manufacturing process is increased. In some embodiments, the electronic device 10 integrated with the electronic device 20 is bonded to a substrate 50. As such, a semiconductor package structure 1 as illustrated in FIG. 1 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package structure, comprising:
   an electronic device having a first active surface; and
   a photonic device having a second active surface facing to and disposed on the first active surface of the electronic device,
   wherein the photonic device has a first sidewall and a second sidewall opposite to the first sidewall, the first sidewall defines a space configured to connect to an optical component, the first sidewall does not overlap the electronic device in a cross-sectional view perspective, and the second sidewall overlaps the electronic device in the cross-sectional view perspective.

2. The semiconductor package structure as claimed in claim 1, wherein the electronic device comprises a die and an encapsulant encapsulating the die, wherein the encapsulant has a first lateral side and a second lateral side opposite to the first lateral side, the first lateral side of the encapsulant is covered by the photonic device in the cross-sectional view perspective, and the second lateral side of the encapsulant is not covered by the photonic device in the cross-sectional view perspective.

3. The semiconductor package structure as claimed in claim 2, further comprising a first conductive element connected to an active surface of the die, wherein the die is electrically connected to the photonic device through the first conductive element, and the encapsulant contacts the active surface of the die and encapsulates the first conductive element.

4. The semiconductor package structure as claimed in claim 3, further comprising a plurality of second conductive elements disposed at a lateral side of the die, wherein the second conductive elements pass through the encapsulant.

5. The semiconductor package structure as claimed in claim 4, wherein a top surface of the first conductive element and top surfaces of the second conductive elements are substantially coplanar.

6. The semiconductor package structure as claimed in claim 4, wherein a top surface of the encapsulant and top surfaces of the second conductive elements are substantially coplanar.

7. The semiconductor package structure as claimed in claim 2, further comprising a plurality of conductive elements disposed on a lateral side of the die and passing through the encapsulant, wherein a distance between two adjacent ones of the conductive elements is less than a distance between the die and either one of the two adjacent ones of the conductive elements.

8. The semiconductor package structure as claimed in claim 1, wherein the optical component is separated from a portion of the photonic device by a gap.

9. The semiconductor package structure as claimed in claim 1, further comprising a redistribution layer disposed between the electronic device and the photonic device, wherein the redistribution layer has a first lateral side and a second lateral side opposite to the first lateral side, the first lateral side of the redistribution layer is covered by the photonic device in the cross-sectional view perspective, and the second lateral side of the redistribution layer is not covered by the photonic device in the cross-sectional view perspective.

10. The semiconductor package structure as claimed in claim 9, wherein the redistribution layer comprises a first conductive trace, a second conductive trace spaced apart from the first conductive trace, and a plurality of conductive vias connected to the first conductive trace and the second conductive trace, and the first conductive trace and the second conductive trace have different thicknesses.

11. The semiconductor package structure as claimed in claim 1, wherein a bottom surface of the optical component is not aligned with a top surface of the electronic device.

12. The semiconductor package structure as claimed in claim 1, further comprising:
a substrate supporting the electronic device and the photonic device; and
a heat sink connected to the photonic device and the substrate.

13. The semiconductor package structure as claimed in claim 12, wherein a portion of the heat sink is disposed adjacent to a lateral side of the electronic device and a lateral side of the photonic device.

14. The semiconductor package structure as claimed in claim 12, further comprising an electronic component disposed on the substrate and spaced apart from the electronic device.

15. A semiconductor package structure, comprising:
a photonic device having an active surface and a first sidewall angled with the active surface, the first sidewall comprising a recess structure proximal to the active surface and configured to accommodate a first optical component; and
an electronic device disposed under the active surface of the photonic device, wherein the electronic device comprises a semiconductor substrate and a through silicon via passing through the semiconductor substrate and electrically connected to the photonic device, the through silicon via comprises a conductive layer, and at least a portion of the conductive layer extends over a bottom surface of the semiconductor substrate.

16. The semiconductor package structure as claimed in claim 15, wherein the through silicon via is covered by the photonic device.

17. The semiconductor package structure as claimed in claim 15,
further comprising:
a dielectric layer covering the conductive layer and the bottom surface of the semiconductor substrate; and
a conductive pad disposed under the dielectric layer and electrically connected to the conductive layer, wherein the conductive pad does not overlap the through silicon via in a cross-sectional view.

18. A semiconductor package structure, comprising:
a photonic device having an active surface and a first sidewall angled with the active surface, the first sidewall comprising a recess structure proximal to the active surface and configured to accommodate a first optical component;
an electronic device disposed under the active surface of the photonic device, wherein the electronic device comprises a semiconductor substrate and a through silicon via passing through the semiconductor substrate and electrically connected to the photonic device; and
a redistribution layer disposed between the photonic device and the semiconductor substrate, wherein the redistribution layer comprises a conductive trace electrically connected to the through silicon via and the photonic device.

19. The semiconductor package structure as claimed in claim 18, further comprising a conductive pad disposed over the redistribution layer and overlapping the through silicon via, wherein the through silicon via is electrically connected to the photonic device through the conductive trace and the conductive pad.

* * * * *